US009817084B2

(12) United States Patent
Deak

(10) Patent No.: US 9,817,084 B2
(45) Date of Patent: Nov. 14, 2017

(54) SINGLE-CHIP MAGNETIC FIELD SENSOR BRIDGE

(71) Applicant: MultiDimension Technology Co., Ltd., Zhangjiagang (CN)

(72) Inventor: James Geza Deak, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 0 days.

(21) Appl. No.: 14/894,258

(22) PCT Filed: May 28, 2014

(86) PCT No.: PCT/CN2014/078662
§ 371 (c)(1),
(2) Date: Nov. 25, 2015

(87) PCT Pub. No.: WO2014/190907
PCT Pub. Date: Dec. 4, 2014

(65) Prior Publication Data
US 2016/0109535 A1 Apr. 21, 2016

(30) Foreign Application Priority Data

May 28, 2013 (CN) .......................... 2013 1 0203311

(51) Int. Cl.
*G01R 33/06* (2006.01)
*G01R 33/09* (2006.01)
(Continued)

(52) U.S. Cl.
CPC ........... *G01R 33/09* (2013.01); *G01R 17/105* (2013.01)

(58) Field of Classification Search
CPC ........ G01R 33/06; G01R 33/09; G01R 17/10; G01B 7/30; H01L 43/02; H01L 43/08; H01L 43/12
(Continued)

(56) References Cited

U.S. PATENT DOCUMENTS

2007/0026681 A1* 2/2007 Shiraiwa ................ B82Y 10/00
438/709
2008/0309331 A1* 12/2008 Qian ...................... B82Y 25/00
324/252

(Continued)

FOREIGN PATENT DOCUMENTS

CN 102226836 A 10/2011
CN 202210144 U 5/2012
(Continued)

OTHER PUBLICATIONS

"International Application No. PCT/CN2014/078662, International Search Report mailed Aug. 19, 2014", (Aug. 19, 2014), 6 pgs.
(Continued)

*Primary Examiner* — Arleen M Vazquez
*Assistant Examiner* — Neel Shah
(74) *Attorney, Agent, or Firm* — Schwegman Lundberg & Woessner, P.A.

(57) ABSTRACT

A single-chip magnetic field sensor bridge, comprising a substrate, a reference arm, a sensing arm, shielding structures, and wire bond pads is disclosed. The reference arm and the sense arm respectively comprise at least two rows/columns of reference element strings and sense element strings formed by electrically connecting one or more identical magnetoresistive sensing elements. The reference element strings and the sense element strings are alternately arranged. The magnetoresistive sensing elements are AMR, GMR or TMR sensing elements. The reference element
(Continued)

strings are provided with shielding structures thereon, and the sensing element strings are located in gaps between two adjacent shielding structures. The shielding structures are arrays of elongated strips composed of permalloy or another soft ferromagnetic material. The sensors can be implemented as one of three different bridge structures, called a quasi-bridge, a half-bridge, or a full-bridge. This single-chip magnetic field sensor bridge has the advantages of small size, low cost, high sensitivity, small offset, good linearity, and good temperature stability.

20 Claims, 6 Drawing Sheets

(51) Int. Cl.
*G01R 17/10* (2006.01)
*G01B 7/30* (2006.01)
*H01L 43/02* (2006.01)
*H01L 43/08* (2006.01)
*H01L 43/12* (2006.01)

(58) Field of Classification Search
USPC .................. 324/207.21, 252; 257/427; 438/3
See application file for complete search history.

(56) References Cited

U.S. PATENT DOCUMENTS

| 2008/0809331 | | 12/2008 | Qian, Zhenghong et al. |
| 2009/0102464 | A1* | 4/2009 | Doogue ................. B82Y 25/00 324/207.21 |
| 2009/0243607 | A1* | 10/2009 | Mather ................. B82Y 25/00 324/249 |
| 2012/0200292 | A1* | 8/2012 | Sugihara ............... B82Y 25/00 324/252 |
| 2014/0266185 | A1* | 9/2014 | Sidman ................. G01R 33/06 324/252 |

FOREIGN PATENT DOCUMENTS

| CN | 102565727 A | 7/2012 |
| CN | 102621504 A | 8/2012 |
| CN | 103267955 | 8/2013 |
| CN | 203337808 | 12/2013 |
| JP | 4861483 | 1/2012 |
| WO | WO-2014/190907 | 12/2014 |

OTHER PUBLICATIONS

"European Application No. 14803530.6, Invitation Pursuant to Rule 62a(1) EPC, dated Jan. 14, 2017", (Jan. 4, 2017), 2 pgs.

* cited by examiner

US 9,817,084 B2

SINGLE-CHIP MAGNETIC FIELD SENSOR BRIDGE

PRIORITY CLAIM TO RELATED APPLICATIONS

This application is a U.S. national stage application filed under 35 U.S.C. §371 from International Application Serial No. PCT/CN2014/078662, which was filed 28 May 2014, and published as WO2014/190907 on 4 Dec. 2014, and which claims priority to China Application No. 201310203311.3, filed 28 May 2013, which applications and publication are incorporated by reference as if reproduced herein and made a part hereof in their entirety, and the benefit of priority of each of which is claimed herein.

TECHNICAL FIELD

The invention relates to magnetic sensor technology especially that involving a single-chip magnetic field sensor bridge with low offset.

BACKGROUND TECHNOLOGY

TMR (tunneling magnetoresistance) sensors are a new magnetoresistive sensing technology that is beginning to find use in industrial applications. This sensor technology uses tunneling magnetoresistive multilayer thin film materials for sensing the magnetic field, and the main features are: the magnetic multilayer film produces a big change in resistance in response to a change in magnitude or direction of the external magnetic field. Compared to other practical applications utilizing the AMR effect (anisotropic magnetoresistance) of the GMR effect (giant magnetoresistance), the rate of change of resistance is much greater, and additionally compared to the Hall Effect it has much better temperature stability.

Although both GMR and TMR are compatible with standard semiconductor manufacturing processes, high sensitivity GMR or TMR sensors have yet not begun low cost mass production. The production yield of GMR and TMR magnetoresistive sensors depends on the achievable offset value, and this is difficult when forming a bridge utilizing GMR or TMR magnetoresistive elements. In order to realize low cost mass production of GMR or TMR sensors, and also to produce single-chip GMR or TMR sensors, there presently are three methods that are used to achieve high sensitivity GMR or TMR sensors.

(1) Through the use of a two film process or local laser annealing, it is possible to set the magnetization of the pinned layers of the different bridge arms in different directions, in order to realize a single-chip sensor bridge. In the two film process, the two respective TMR pinned layers are set in opposite directions; it makes the process complicated, because it requires a second annealing that affects the layer that was deposited first, the makes the matching of the two films less consistent, which affects the overall performance of the sensor. When using local laser annealing to locally flip the pinned layer magnetization, the same film is used for both arms but it is locally annealed in a strong magnetic field, to make the two adjacent pinning layers have opposite pinned layer magnetization direction, in order to achieve a single-chip magnetic field sensor bridge. Unfortunately, this method requires custom equipment, which is expensive to develop, and the local laser annealing process is slow.

(2) The free layer's magnetization direction can be tilted. Each sensor arm has the same pinned layer magnetization direction, but the free layer of adjacent arms may have different magnetization directions, wherein the angle of the free layer magnetization with respect to the pinned layer magnetization has the same magnitude but different polarity for the different arms. Unfortunately, this method leads to smaller dynamic range of the sensor response, reducing the operating range.

(3) using magnetic shielding to provide flux concentrators in referenced bridge sensors, in the present art this method results in large spatial separation between the reference and sense arms making it difficult to control offset, large die size, and high cost.

FIG. 1 shows the present common implementation of prior art single-chip magnetic field sensor bridges. The structure includes a silicon substrate 1, shielding structures 2, sense elements 3, reference elements 4, a gap 5, four wire bonding pads 7-10 used for input and output, one is for power $V_{bias}$, one is for grounding GND, and two are for output voltage V+, V−, and the sensor detects the field along a sensing axis 100. The reference elements are located under the shielding structures 2, and the sense elements 3 are located in the gap 5 between the shielding structures 2, wherein the shielding structures have a rectangular shape. The sense elements 3 are interconnected to form a sense arm, and the reference elements 4 are interconnected to form a reference arm, the sense arm 3 and the reference arm 4 are composed of GMR sensing elements. The silicon substrate 1 has its longest dimension parallel to the sensing axis 100, the reference elements 4 and sensing elements 3 are spatially located far apart, leading to a long distance between the sense arms and reference arms; there is only one gap 5, this arrangement is spatially inefficient, and it makes the chip size large, typically this kind of design leads to a chip size of at least 2 mm×0.5 mm. Also, because the spacing between the sense arms and reference arms is large, the bridge is not well balanced, and the reference arms and sensing arms can have different temperatures, making thermal compensation of the bridge less effective. In addition, the rectangular shield structures 2, are easily saturated in moderate magnetic fields, leading to nonuniform magnetic field distribution between the center and the edge, and it can produce magnetic hysteresis, all of these issues reduce the linearity of the sensor.

SUMMARY OF THE INVENTION

The purpose of the present invention is to overcome the above problems of the prior art, to provide a small, low cost, single-chip bridge magnetic field sensor bridge with low offset, high sensitivity, and good linearity.

In order to achieve the above technical goals, and to achieve the technical results stated above, the present invention may be realized by the following technical scheme:

The present invention provides a single-chip magnetic field sensor bridge, comprising: a substrate;

deposited on said substrate a Wheatstone half-bridge, a Wheatstone quasi-bridge, said Wheatstone half-bridge or quasi-bridge including: a reference arm R1, which includes at least two row/column reference element strings, each reference element string includes one or more identical sensing elements electrically interconnected; further including a sensing arm S1, which includes at least two row/column reference element strings, each reference element string includes one or more identical sensing elements electrically interconnected; the reference and the sensing arms have the same number of rows/columns, along the horizontal/vertical spacing directions, the spacing between the adjacent reference element strings and the adjacent sensing element strings is the same; at least three shielding structures, with a well defined gap between the shielding structures, each reference element string has a corresponding shielding structure, each sensing element string is located in the corresponding gap, and further including multiple input and output wire bond pads.

Preferably, the magnetoresistive sensor elements are AMR, GMR, or TMR sensor elements.

Further, the magnetoresistive sensor element is a magnetic field sensor element with linear magnetic field response characteristics.

Further, the magnetoresistive sensor element is a magnetic field sensor element with multilayer magnetic field response characteristics.

Preferably, the reference element string and the sense element string have the same number of magnetoresistive sensing elements.

Preferably, the single-chip magnetic field sensor bridge includes three wire bond pads, the first of the three wire bond pads is used to supply the bias voltage, the second is used for the output signal, and the third is used for grounding, said reference arm R1, said sense arm S1 all have their respective first end and second ends connected such that the first end of the reference arm is connected to the first wire bond pad, said third bond pad and the sense arm S1 first end are electrically connected, said second bond pad is electrically connected with the second end of the reference arm as well as electrically connected with the second end of the sense arm.

Preferably, the single-chip magnetic field sensor bridge has three bond pads, the first bond pad is used for grounding, while the second and the third bond pads are used for the output, and the so described Wheatstone bridge includes two identical current sources I1 and I2, both current sources I1 and I2, the reference arm R1 and the sense arm S1 all respectively have a first end and a second end, said first wire bond pad is connected with the first end of the reference arm R1, the first end of the sensing arm S1, and additionally electrically connected with the first end of a current sources (I1, I2), the second wire bond pad is electrically connected with the second end of reference arm R1 and the second end of current source I2, the third wire bond pad is electrically connected with the second end of sense are S1 and the second end of current source I1.

Preferably, the shielding structures are elongated along the same horizontal/vertical direction, and they are composed of alloys including one or more of the materials Ni, Fe, Co, Si, B, Ni, Zr, or Al.

Preferably, there is a gap between the shielding structures chosen such that the magnetic field gain factor is between $1<A_{sns}<100$, and the magnetic field in the region above or below the magnetic shield structures is described by the magnetic field attenuation coefficient $0<A_{ref}<1$.

Preferably, the reference element string, the sense element string, and the bonds pads are electrically interconnected to each other.

Preferably, the substrate includes CMOS, and the CMOS, the reference arm, the sense arm, and the wire bond pads are lithographically defined on the substrate.

The present invention also provides a single-chip magnetic field sensor bridge, and it comprises
a substrate;
deposited on said substrate a Wheatstone full-bridge, the Wheatstone full-bridge includes mutual interconnection between a first bridge arm and a second bridge arm, the first bridge arm includes:

a first reference arm R1, which includes at least two rows/columns of the first reference element string, each first reference element string consists of one or more electrically interconnected magnetoresistive sensor elements; as well as a first sense arm S1, which includes at least two rows/columns of the first sense element string, each first sense element string consists of one or more electrically interconnected magnetoresistive sensor elements; the reference element string and the sense element string have the same number of rows/columns, and the spacing along the longitudinal/vertical direction, describing the adjacent first reference element strings and first sense element strings is defined by length L;

the second bridge arm includes:

a second reference arm R2, which includes at least two rows/columns of the first reference element string, each reference element string consists of one or more electrically interconnected magnetoresistive sensor elements; as well as a second sense arm S1, which includes at least two rows/columns of the second sense element string, each sense element string consists of one or more electrically interconnected magnetoresistive sensor elements; the second reference element string and the second sense element string have the same number of rows/columns, and the spacing along the longitudinal/vertical direction, describing the adjacent second reference element strings and second sense element strings is defined by length L;

in the area between said first bridge arm and said second bridge arm the first reference element string and the second reference element string or the first sense element string and the second reference element string are located adjacent to each other; the adjacent the first reference element string and the second reference element string or the first sense element string and the second reference element string are separated by a distance 2L;

at least three shielding structures, wherein the shielding structures have a nearest neighbor spacing, and each of the first reference element strings and each of the second reference element strings are under a corresponding shielding structure, and each of the first sense element stings and each of the second elements strings is located in the gaps between the shielding structures;

and a multiplicity of input and output wire bond pads.

Preferably, the single-chip magnetic field sensor bridge includes four wire bond pads, these four wire bond pads are respectively defined as a first wire bond pad used for bias voltage, the second and third wire bond pads are used for outputs, and the fourth wire bond pad is used for grounding, the reference arm R1, the reference arm R2, the sensing arm S1 and the sensing arm S2 respectively have a first end and a second end, and the first bond pad is electrically connected with the second end of reference arm R2 and the first end of sensing arm S1, the second wire bond pad is electrically connected with the second end of reference arm R1 and the second end of sensing arm S1, the third wire bond pad is electrically connected with the first end of sensing arm S2 and the first end of reference arm R2, and the fourth wire bond pad is electrically connected with the second end of sensing arm S2 and the first end of reference arm R1.

Preferably, the shielding structures are elongated along the same horizontal/vertical direction, and they are composed of alloys including one or more of the materials Ni, Fe, Co, Si, B, Ni, Zr, or Al.

Preferably, there is a gap between the shielding structures chosen such that the magnetic field gain factor is between $1<A_{sns}<100$, and the magnetic field in the region above or below the magnetic shield structures is described by the magnetic field attenuation coefficient 0<Aref<1.

Preferably, the reference element string, the sense element string, and the bonds pads are electrically interconnected to each other.

Preferably, the magnetoresistive sensor elements are AMR, GMR, or TMR sensor elements.

Further, the magnetoresistive sensor element is a magnetic field sensor element with a linear magnetic field response characteristic.

Further, the magnetoresistive sensor element is a magnetic field sensor element with a multi layer magnetic field response characteristic.

Preferably, the second reference element string and the first reference element string have the same number of rows/columns, while the second sense element string and the first sense element string have the same number of rows/columns.

Preferably, the number of first reference element strings, the number of first sense element stings, the number of second reference element strings, and the number of second sense element strings is the same.

Preferably, the substrate includes CMOS, and the CMOS, the reference arm, the sense arm, and the wire bond pads are lithographically defined on the substrate.

Compared with the prior art, the present invention has the following advantages:

(1) The reference arm and the sense arm magnetoresistive elements have the same pinned layer direction, so that it is not necessary to use two different thin films or a local annealing process in order to yield a single-chip sensor.

(2) Through the use of the elongated shield structure, the sensor can achieve good linearity and high sensitivity, while keeping the saturation field relatively high, thereby increasing the dynamic range of the sensor.

(3) The reference arms and the sense arms are interleaved, and between the two of them there is a small spacing, this reduces sensor offset, and improves the temperature performance, while reducing the size, and decreasing the cost.

BRIEF DESCRIPTION OF THE FIGURES

In order to more clearly illustrate the technical solutions and technical embodiment of the present invention, the following figures provide a simple introduction for various possible implementations of the present invention. Obviously, the following descriptions of the drawings do not exhaustively list all possible permutations of the present invention. The average person skilled in the art, may without any creative effort, can provide other diagrams within the scope of the present invention.

DESCRIPTION OF THE PREFERRED EMBODIMENTS

The description below in conjunction with the accompanying drawings will further describe various embodiments of the present invention.

Example 1

Figure 2:
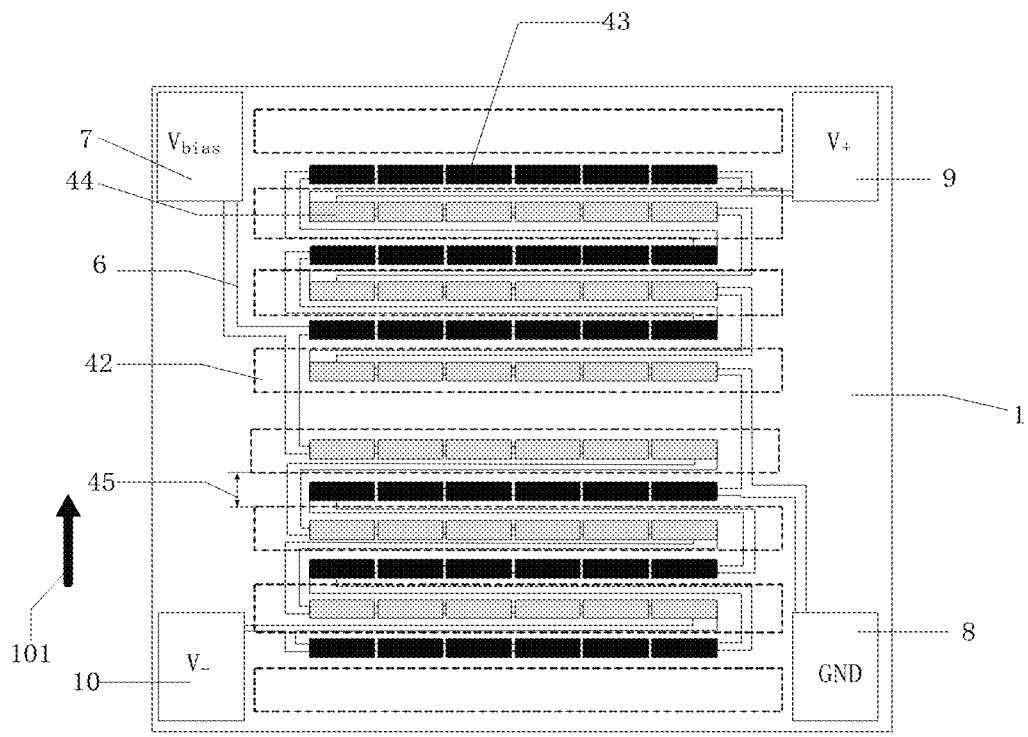
FIG. 2 shows a schematic diagram of a single-chip full-bridge magnetic field sensor of the present invention.

FIG. 2 shows a schematic diagram of a single-chip full-bridge magnetic field sensor of the present invention. The sensor comprises a substrate 1, a Wheatstone full-bridge deposited on the substrate 1, eight shielding structures 42 and four pads 7-10. The first bridge comprises reference arm R1 and sense arm S1, while the second bridge arm comprises reference arm R2 and sense arm S2; the reference arms R1 and R2 include three reference element strings each respectively, three in the first reference arm, and three in the second reference arm; the sense arms S1 and S2 include three sense element strings each respectively, three in the first sense arm, and three in the second sense arm. Each reference element string and each sensor element string are composed of one or more identical magnetoresistive sense elements that are electrically interconnected. As shown in FIG. 2, reference arm R1 and sense arm S1, reference arm R2 and sense arm S2 are composed of six identical magnetoresistive sensor elements. The first reference element string and the first sense element string have the same longitudinal spacing. The second reference element string and the second sense element string have the same longitudinal spacing. The first reference element string and the first sense element string have the same spacing between every two adjacent elements. The second reference element string and the second sense element string have the identical spacing between every two adjacent elements, and this spacing is defined as L. The first reference element string and the second reference element string are the nearest neighboring strings between the two bridge arms. The distance between the first reference element string and the second reference element string is 2L. Shield structure 42 has a specified gap 45, and the size of the gap is the same for all adjacent shielding structures. Each first reference element string and second reference element string sits under a corresponding shielding structure 42, and each first sense element string and second sense element string is located in a gap 45. There are four wire bond pads 7-10, where the first wire bond pad 7 is for bias voltage, the second wire bond pad 9 and the third wire bond pad 10 are for output signals, and the fourth wire bond pad 8 is for grounding. Reference arm R1, reference arm R2, sense arm S1, and sense arm S2 each have a first end and a second end. The first bond pad 7 is connected to the second end of reference arm R2 and the first end of sense arm S1. The second wire bond pad 9 is connected to the second end of reference arm R1 and the second end of sense arm S1. The third wire bond pad 10 is connected to the first end of sense arm S2 and the first end of reference arm R2. The fourth wire bond pad 8 is connected to the second end of sense arm S2 and the first end of reference arm R1. The six sensing elements in each string are also electrically interconnected.

Figure 1:
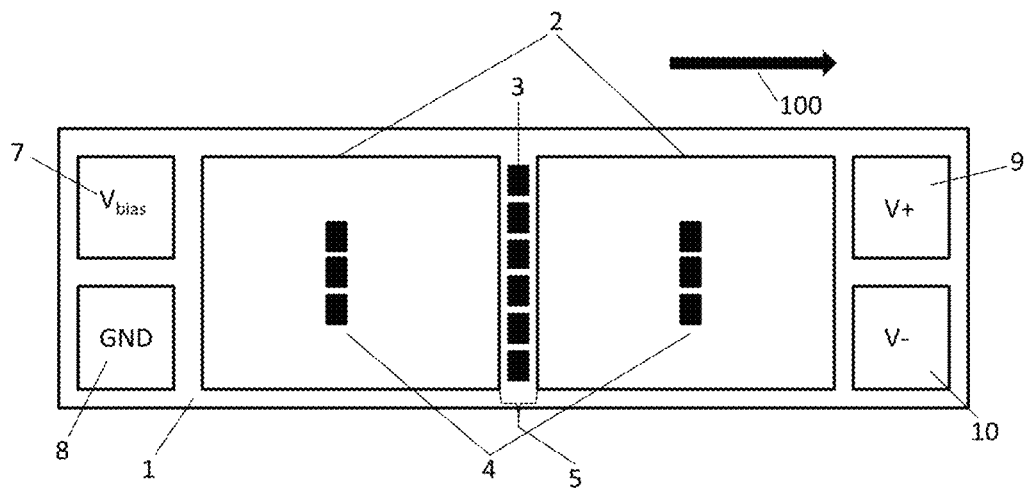
FIG. 1 shows a schematic structural view of the prior art single-chip magnetic field sensor bridge.
Figure 3:
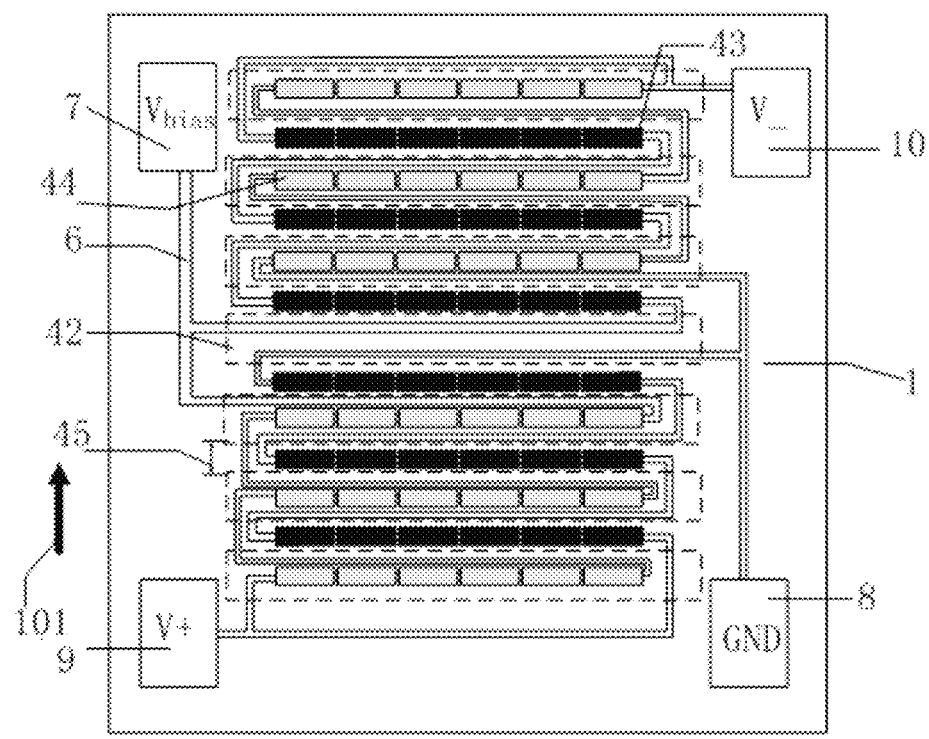
FIG. 3 shows another schematic diagram of a single-chip full-bridge magnetic field sensor of the present invention.

There are several differences compared to FIG. 1: the present invention uses at least three shielding structures, as shown in FIG. 2 there are 8 shielding structures 42, whereas FIG. 1 only shows two shielding structures 2. The present invention has at least two gaps, and FIG. 2 shows 7 gaps 45, whereas FIG. 1 only shows one gap 5. Each sensing arm includes at least two rows/columns of sense element strings 43, each reference arm includes at least two rows/columns of reference element strings 44. FIG. 2 shows 6 sense element strings 43 and 6 reference element strings 44, and FIG. 1 shows only one of each type of string per arm. Sense element strings 43 and reference element strings 44 are interleaved, where each sensing element string 43 and reference element string 44 are separated by a distance L. For an even number of shields 42 as shown in FIG. 2, in the middle between the adjacent reference element strings, the spacing is 2L. For an odd number of shielding structures 42 as shown in FIG. 3, there can be two adjacent sense element strings, and these would be separated by distance 2L. The length L is small, preferably from 20 um to 100 um. The sense element strings 43 and the reference element strings are composed of a multiplicity of AMR, GMR, or TMR magnetoresistive elements that are electrically interconnected. Each reference element string 44 has a corresponding shielding structure 42, and each sense element string 43 sits in the gap 45 between adjacent shielding structures 42. The shielding structures are composed a soft ferromagnetic alloy containing but not limited to Ni, Fe, Co, Si, B, Ni, Zr, or Al. The sense arms, the reference arms, the wire bond pads 7-10, and all 6 conductors are electrically connected. Preferably the chip size is 0.5 mm×0.5 mm, which is smaller than existing technology. According to requirements of different applications, the chip can be made smaller than 0.5 mm×0.5 mm. The substrate 1 may contain CMOS, where the CMOS, sensing arm, reference arm, and the wire bond pads 7-10, may be lithographically printed directly on the substrate.

Figure 4:
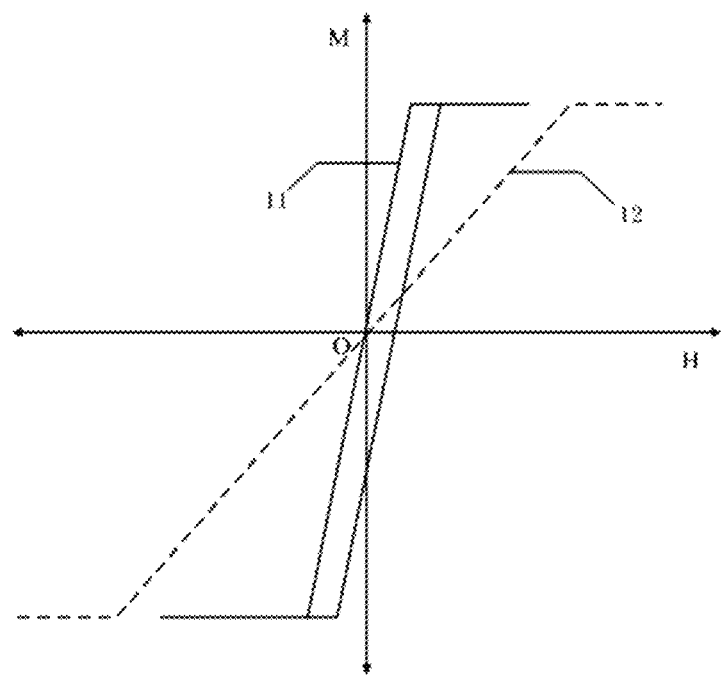
FIG. 4 shows the magnetization as a function of applied magnetic field curve for an elongated rectangular shield structure.

When the direction of the applied magnetic field 101 is parallel to the short dimension of the shield structure 42, theoretically, the magnetization curves should appear as shown in FIG. 4. Curve 11 is for a low aspect ratio shielding structure, and curve 12 is for a high aspect ratio shielding structure.

Figure 5:
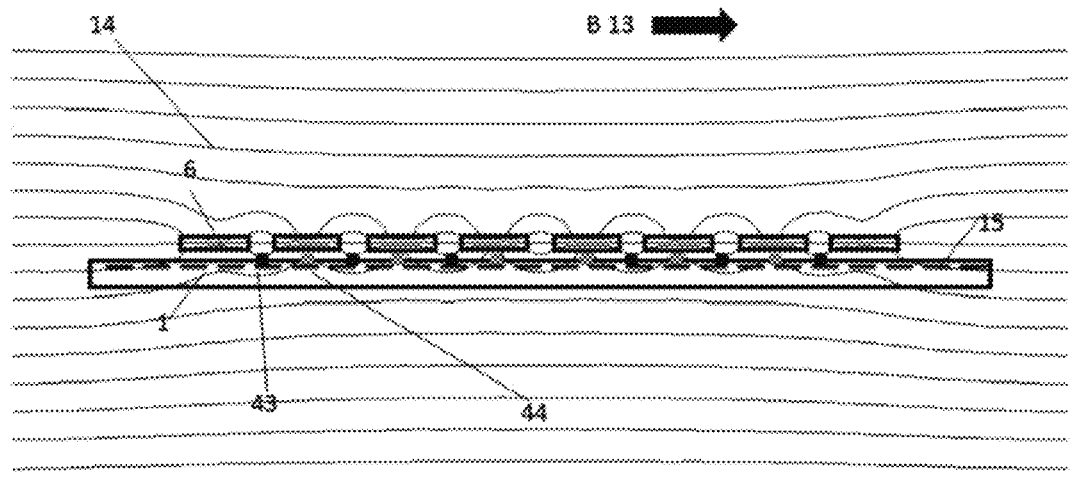
FIG. 5 shows the magnetic field distribution around the shield structure of the present invention caused by an external magnetic field.

As can be seen from FIG. 4, compared with the low aspect ratio shield structure, the use of a long strip shielding structure has a higher saturation point, and a better linearity. FIG. 5 shows the magnetic field distribution around the reference element strings 44 and the sense element strings 43 shown in FIG. 2. Form this figure, it can be observed the field present in the gaps 45 between shielding structures 42 acting on sense element strings 43 is increased, and the magnetic field under the shields 42 in the location of reference element strings 44 is decreased.

Figure 6:
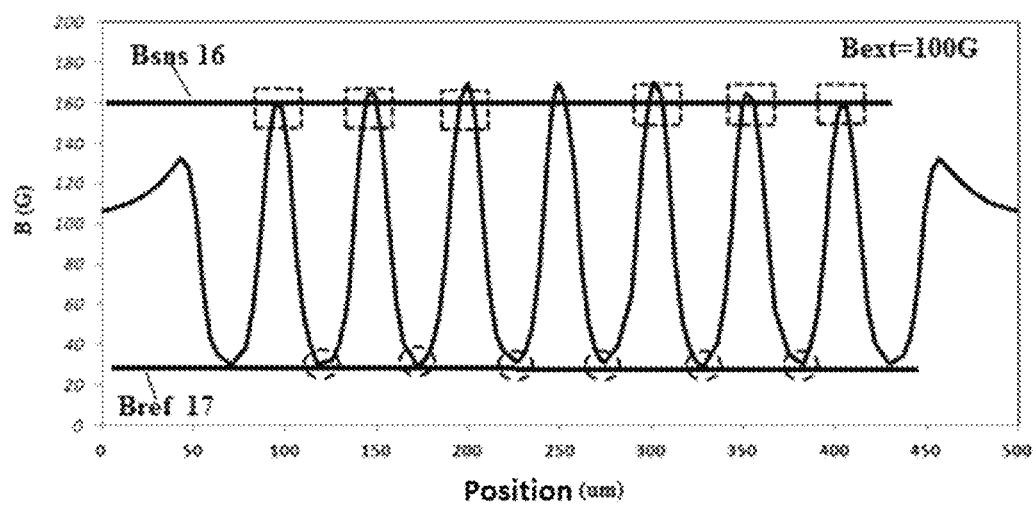
FIG. 6 shows a plot of the magnetic field intensity in the vicinity of the MTJ elements of the reference arms and the sense arms.

FIG. 6 shows the induced magnetic field at the position of the sense element strings 43 and the reference element strings 44 for the geometry in FIG. 2. $B_{sns}$ is defined as the field at the location of the sense element strings 43, and $B_{ref}$ is defined as the field at the location of the reference element strings 44, when the external magnetic field is $B_{ext}$=100 G. From this figure we can deduce: $B_{sns}$=160 G, $B_{ref}$=25 G.

Then according to equations (1) and (2) given below, we can determine the gain factor $A_{sns}$ and attenuation factor $A_{ref}$.

$$B_{sns}=A_{sns}*B_{ext} \quad (1)$$

$$B_{ref}=A_{ref}*B_{ext} \quad (2)$$

Given $B_{sns}$=160 G, $B_{ref}$=25 G the above two equations indicate $A_{sns}$=1.6, $A_{ref}$=0.25. The bigger the ratio of $A_{sns}/A_{ref}$, the better the shielding design is, ideally $A_{sns}/A_{ref}$>5 is acceptable for high sensitivity. In this case $A_{sns}/A_{ref}$=1.6/0.25=6.4>5, meaning that the invention has achieved high sensitivity and the shielding design is quite good. In the above design sense element string 43 is used for both the first and second sense element string, and reference element string 44 is used for both the first and second reference element strings.

In this present example, the magnetoresistive sensors are aligned along the horizontal direction (arranged as rows), the first sense element strings and the first reference element strings are arranged in alternating rows, the second sense element strings and the second reference element strings are arranged in alternating rows, the shielding structures are aligned along the horizontal direction, and the gaps are aligned along the horizontal direction. Obviously, when the magnetoresistive sensor elements are aligned along the longitudinal direction (arranged as columns) the first reference element string and first sensing element string are in alternating columns, and the second reference element string and second sense element string are arranged in columns. The shielding structures are aligned in the vertical direction, and the gaps are aligned in the vertical direction. The vertical arrangement is within the scope of the invention.

FIG. 3 shows another example implementation of the single-chip full-bridge magnetic field sensor. The difference with the FIG. 2 example is there are 7 shielding structures 42, the two end shielding structures have reference element strings beneath them, and the center shielding structure has no reference element string beneath it. The first bridge arm and the second bridge arm have the first and second sense element strings at their common border, where the gap between the first sense element string and the second sense element string is 2L.

Example 2

Figure 12:
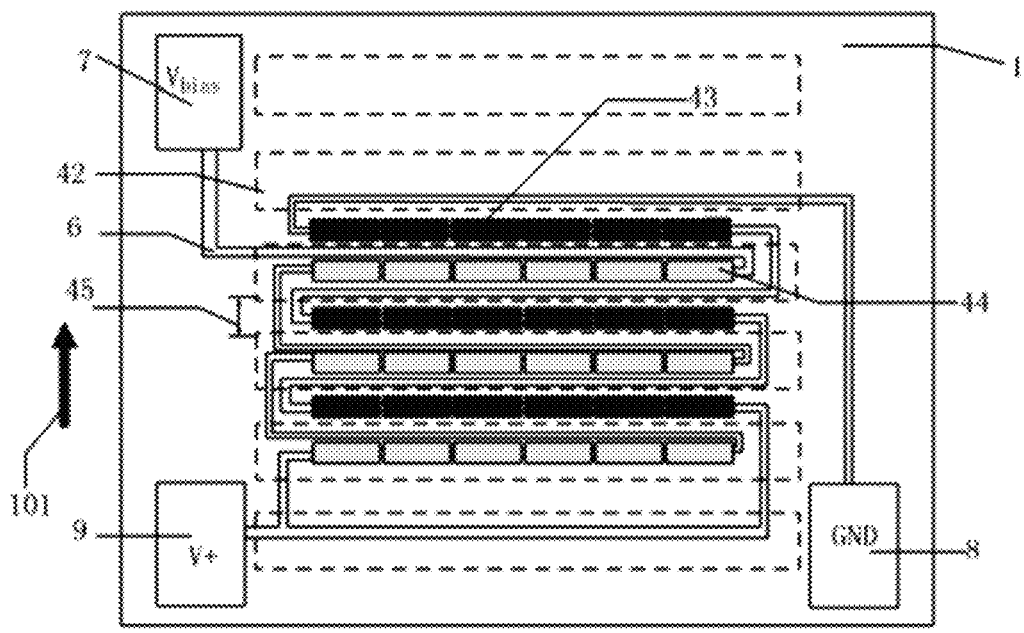
FIG. 12 shows a present invention implementation of a half-bridge magnetic field sensor.

FIG. 12 shows another implementation of the present invention. The sensor consists of a substrate 1, and onto the substrate a Wheatstone half-bridge is deposited, it has 6 shielding structures 42, and three wire bond pads 7-9. The Wheatstone half-bridge includes a reference arm R1 and a sense arm S1, each individually including 3 horizontal reference element strings 44 and 3 horizontal sense element strings 43, each reference element string 44 and each sense element string 43 includes a multitude of identical magnetoresistive sensing elements electrically interconnected, and there are 6 magnetoresistive elements per string shown in the figure. The sense element strings 43 and the reference element strings 44 are spaced vertically with respect to each other, and the spacing between the adjacent reference element strings 44 and sense element strings is L. The adjacent shielding structures 42 have a gap 45 between them, where the length and width of the gap 45 are different. Each reference element string 44 is located beneath a corresponding shielding structure 42, and each sense element string is located in the gap 45. The sensing element strings 43 and the reference element strings may be composed of one of AMR, GMR, or TMR electrically interconnected magnetoresistive sensing elements. The shielding structures 42 are composed of soft ferromagnetic alloys of one or more of the elements Ni, Fe, Co, Si, B, Ni, Zr, or Al, but they need not be limited by these specific elements. The 6 elements in each sensor are electrically interconnected.

In this example, the magnetoresistive sensor elements are aligned along the horizontal direction (arranged in rows), each sense element string and each reference element string alternate along the vertical direction, the shielding structures are aligned in the horizontal direction, and the gaps have a long dimension along the horizontal direction. Alternatively, the magnetoresistive sensor elements may be aligned along the vertical direction (arranged in columns), each sense element string and each reference element string alternate along the horizontal direction, the shielding structures are aligned in the vertical direction, and the gaps have a long dimension along the vertical direction. Alignment along the vertical direction is therefore not outside the scope of this invention.

In the present embodiment, a single-chip magnetic sensor bridge includes three pads 7-9, the three pads are a first pad 7 for supplying a bias voltage, a second pad 9 for outputting a signal, and a third pad 8 for grounding. Reference arm R1 has a first end and a second end, and sense arm S1 has a first end and a second end. The first wire bond pad 7 is electrically connected with the first end of reference arm R1, the third wire bond pad 8 is electrically connected with the first end of sense arm S1, and the second wire bond pad 9 is electrically connected with the second end of reference arm R1 and the second end of sense arm S1.

Example 3

The difference between this example and the second example is the use of a quasi Wheatstone bridge circuit. This single-chip magnetic field sensor bridge contains three wire bond pads, and of the three wire bond pads the first is used for grounding, while the second wire bond pad and the third wire bond pads are used for signal outputs. The Wheatstone quasi-bridge includes two identical current sources I1 and I2, a reference arm R1, and a sense arm S1. The current sources I1 and I2, the reference arm R1 and the sense arm S1 each have a first end and a second end. The first wire bond pad is electrically connected with the first end of reference arm R1, the first end of sense arm S1, and the first end of the two current sources I1 and I2. The second wire bond pad is electrically connected with the second end of reference are R1 and the second end of current source I2. The third wire bond pad is electrically connected with the second end of sense arm S1 and with the second end of current source I1.

Example 4

Single-chip magnetic field sensor bridges may be designed to have linear or multilayer type response.

For a single-chip magnetic field sensor bridge with linear response the sense element string 43 and the reference element string 44 are comprised of MTJ elements, wherein the MTJ elements have the following features: a pinning layer, a tunnel barrier, and a ferromagnetic free layer. The pinned layer includes at least one antiferromagnetic layer and at least one ferromagnetic layer, the antiferromagnetic layer can consist of IrMn, PtMn, or other materials, the material for the ferromagnetic layers can be alloys of Co, Fe, Ni, B, Pd, Tb, or Hf, although it need not be limited to this set of materials. The pinned layer may also include a laminated layer, comprising two ferromagnetic layers magnetically coupled using a non-magnetic layer, the tow ferromagnetic layers can be NiFe, NiFeO, CoFe, Co, but not limited to these materials, and the non-magnetic coupling layer is usually Ru. The free layer material can be alloys of Co, Fe, Ni, B, Pd, Tb, or Hf, although it need not be limited to this set of materials. The magnetization of the pinned layer is presumed to be rigidly fixed in its direction, and it does not change orientation as with the external magnetic field, whereas, the magnetization of the free layer changes in response to the external magnetic field. In the absence of an external magnetic field, the free layer magnetization needs to be aligned perpendicular to the pinned layer magnetization, this can be achieved using additional layers above the free layer, by the use of permanent magnets, or using shape anisotropy. The tunnel barrier is an insulating material, usually in the form of an oxide, such as $Al_2O_3$ or MgO. Preferably, the MTJ has the following structure:

Silicon substrate/seed layer/pinned layer/tunnel barrier layer/free layer/bias layer/capping layer, wherein the pinned layer is PtMn/CoFe/Ru/CoFeB, the tunnel barrier layer material is MgO, the free layer CoFeB/NiFe, and the bias layer material is IrMn.

Figure 7:
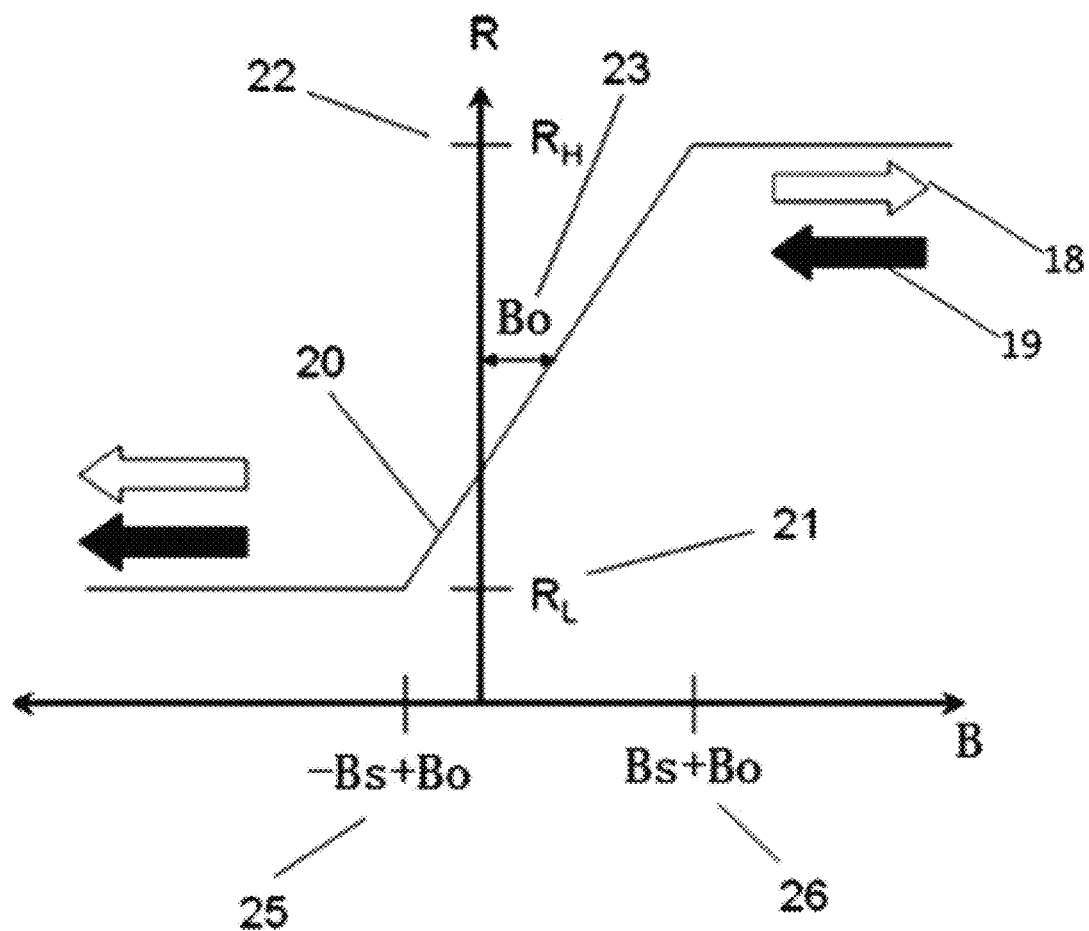
FIG. 7 shows a transfer curve of the magnetoresistive elements of the sense and reference arms of the present invention.

The transfer curve 20 of a single-chip magnetic field sensor element is shown in FIG. 7. When the applied magnetic field direction 101 and the pinning layer magnetization 19 are parallel, and the magnitude of the applied magnetic field is greater than $-Bs+Bo$ (25), the magnetization direction of the magnetic free layer 18 aligns parallel with the applied magnetic field direction 101, and thus parallel with the pinned layer magnetization direction 19, such that the MTJ element will be in the low resistance state $R_L$ (21). When the applied magnetic field direction 101 and the pinning layer magnetization 19 are anti-parallel, and the magnitude of the applied magnetic field is greater than $Bs+Bo$ (26), the magnetization direction of the magnetic free layer 18 aligns parallel with the applied magnetic field direction 101, and thus anti-parallel with the pinned layer magnetization direction 19, such that the MTJ element will be in the low resistance state $R_H$ (22). When the external applied magnetic field 101 has a magnitude of Bo (23), the magnetization direction of the free layer 18 is perpendicular to the magnetization direction of the pinned layer 19, then the MTJ magnetoresistance will be at the midpoint between $R_L$ (21) and $R_H$ (22), that is $(R_L+R_H)/2$. $-Bs+Bo$ (25) to $Bs+Bo$ (26) represents the operating range of the single-chip magnetic field sensor bridge. From the figure we can see, curve 21 is linear from $-Bs+Bo$ (25) to $Bs+Bo$ (26), with slope $$(R_H - R_L)/2B_S = \Delta R/\Delta B \quad (4)$$

from $-Bs+Bo$ (25) to $Bs+Bo$ (26) the magnetoresistance may be represented $$R(B_{ext}) = R_L + (\Delta R/\Delta B)^* B_{ext} \quad (5)$$

Then according to equations (1) and (2), the magnetoresistance of the sense and reference arms is:

$$R_{sns}(B_{ext}) = R_L + A_{sns}^* (\Delta R/\Delta B)^* B_{ext} \quad (6)$$

$$R_{ref}(B_{ext}) = R_L + A_{ref}^* (\Delta R/\Delta B)^* B_{ext} \quad (7)$$

The sense element string 43 and the reference element string 44 may also be composed of GMR spin-valve materials, with the same response curve as shown in FIG. 6. FIG. 7 shows the sensor has good linearity.

Example 5

Figure 8:
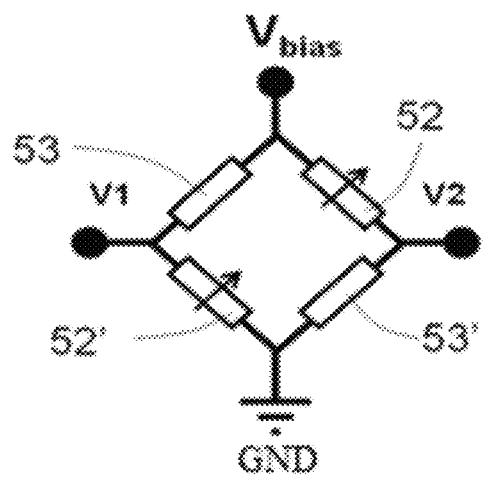
FIG. 8 shows a full-bridge circuit diagram for the present invention.

FIG. 8 shows the schematic diagram for a linear single-chip full-bridge magnetic field sensor. In the figure, there are two sense arms S1 (52) and S2 (52') and two reference arms R1 (53) and R2 (53') electrically interconnected to form a full bridge. The sense arms S1 (52) and S2 (52') and reference arms R1 (53) and R2 (53') may be composed of AMR, GMR, or TMR magnetoresistive elements, and if present, the direction of the pinning layer is the same in all bridge arms. In this structure, there are four wire bond pads, a wire bond pad for bias voltage $V_{bias}$, two half-bridge voltage outputs (V1, V2) and a wire bond pad for grounding GND. $V_{bias}$ is connected to an end of reference arm R1 (53) and an end of sense arm S1 (52), V2 is connected to the an end of sense arm S1 (52) and to an end of reference arm R2 (53'), V1 is connected to and end of reference arm R1 (53) and an end of sense arm S2 (52'), and GND is connected with an end of sense arm S2 (52') and an end of reference arm R2 (53'). The full-bridge sensor output may be written $$V = V1 - V2 = \qquad (8)$$

$$\frac{R_{sns}}{R_{sns}+R_{ref}}V_{bias} - \frac{R_{ref}}{R_{sns}+R_{ref}}V_{bias} = \frac{(A_{sns}-A_{ref})\left(\frac{\Delta R}{\Delta B}\right)B}{2R_L + (A_{sns}+A_{ref})\left(\frac{\Delta R}{\Delta B}\right)B}V_{bias}$$

and the sensitivity of the sensor may be expressed as $$\frac{V}{V_{bias}} = \frac{(A_{sns}-A_{ref})\left(\frac{\Delta R}{\Delta B}\right)B}{2R_L + (A_{sns}+A_{ref})\left(\frac{\Delta R}{\Delta B}\right)B} \qquad (9)$$

for very small external magnetic field, that is when B is very small, the sensitivity (9) may be approximated $$\frac{V}{V_{bias}} \approx \frac{(A_{sns}-A_{ref})}{2R_L}\left(\frac{\Delta R}{\Delta B}\right)B \qquad (10)$$

Figure 9:
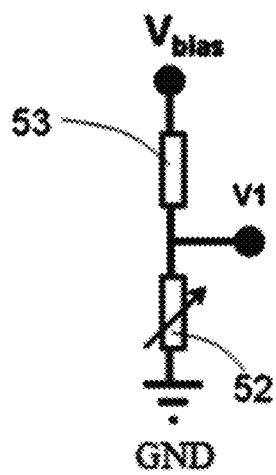
FIG. 9 shows a half-bridge circuit diagram for the present invention.

FIG. 9 shows a schematic diagram for a half-bridge single-chip linear magnetic field sensor. In this figure, there is a sense arm S1 (52) and a reference arm R1 (53), electrically interconnected as a half-bridge circuit. The sense arm S1 (52) and the reference arms R1 (53) may be composed of AMR, GMR, or TMR magnetoresistive elements, and if present, the direction of the pinning layer is the same in all bridge arms. In this structure, there are three wire bond pads, a wire bond pad for bias voltage $V_{bias}$, a half-bridge voltage output V1, and a wire bond pad for grounding GND. Vbias is connected to an end of reference arm R1 (53), V1 is connected to an end of sense arm S1 (52) and to an end of reference arm R1 (53), GND is connected with an end of sense arm S1 (52). The full-bridge sensor output may be written $$V = \frac{R_{sns}}{R_{sns}+R_{ref}}V_{bias} = \frac{A_{sns}\left(\frac{\Delta R}{\Delta B}\right)B}{2R_L + (A_{sns}+A_{ref})\left(\frac{\Delta R}{\Delta B}\right)B}V_{bias} \qquad (11)$$

The sensitivity of the sensor can be expressed as $$\frac{V}{V_{bias}} = \frac{R_L + A_{sns}\left(\frac{\Delta R}{\Delta B}\right)B}{2R_L + (A_{sns}+A_{ref})\left(\frac{\Delta R}{\Delta B}\right)B} \qquad (12)$$

for very small external magnetic field, that is when B is very small, the sensitivity (12) may be approximated $$\frac{V}{V_{bias}} \approx \frac{1}{2} + \frac{A_{sns}}{2R_L}\left(\frac{\Delta R}{\Delta B}\right)B \qquad (13)$$

Figure 10:
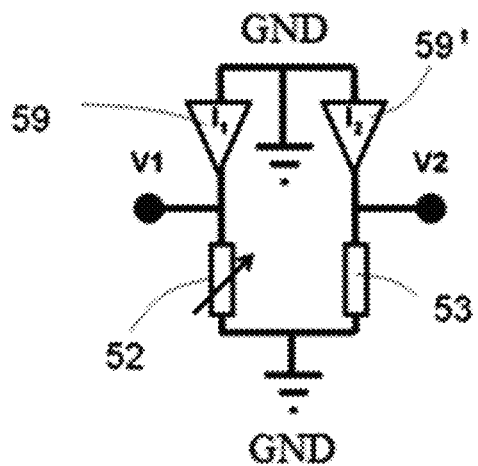
FIG. 10 shows a quasi-bridge circuit diagram for the present invention.

From (9) and (12) it can be seen, when the magnetic field is large, that is the magnetic field strength B is large, the above two half-bridge and full-bridge expressions for magnetic field strength B as a function of V/$V_{bias}$ are no longer linear, and this restricts the operating range of the sensors, for this reason, the circuit drawn in FIG. 10 for a linear quasi-bridge magnetic field sensor is provided in order to give improved performance.

This circuit comprises two current sources I1 59 and I2 59', a sense arm S1 52 and a reference arm R1 53. These two current sources are equal in magnitude, both $I_{BIAS}$. The sense arm S1 52 and reference arm R1 53 may be composed of AMR, GMR, or MTJ magnetoresistive sensor element, and if present the direction of magnetization pinned layer are the same in each arm. The structure has three pads, one of which is used as a ground terminal GND, the other two as a half-bridge voltage output terminals (V1, V2), wherein GND electrically connected to one end of the two current sources, one end of sense arm S1 52, and one end of reference arms R1 53. V1 is connected to the other end of current source I1 59 and sense arm S1 59. V2 is connected to the other end of current source I2 59' and reference arm R1 53. The total output voltage of this circuit is $$V = V1 - V2 = (A_{sns}-A_{ref})\left(\frac{\Delta R}{\Delta B}\right)B * I_{bias} \qquad (14)$$

with sensitivity $$\frac{V}{I_{bias}} = (A_{sns}-A_{ref})\left(\frac{\Delta R}{\Delta B}\right)B \qquad (15)$$

From (15) it can be seen that the sensitivity V/$I_{bias}$ has a linear relationship with the magnetic field strength B. If $I_{bias}=V_{bias}/2R_L$, then the quasi-bridge magnetic field sensor and the full-bridge magnetic field sensors have identical sensitivity, but the quasi-bridge magnetic field sensor has better linearity, making it more suitable for wide dynamic range sensing.

Example 6

In another implementation of this invention, a multilayer-response magnetoresistive element may be used, here the reference element string 44 and the sense element string 43 are utilize MTJ elements, wherein the MTJ elements have the following properties: a pinning layer, a tunnel barrier, and a ferromagnetic free layer. The pinning layer includes an antiferromagnetic layer and at least one ferromagnetic layer, the antiferromagnetic layer is usually IrMn or PtMn, although other antiferromagnetic materials may be used, and the ferromagnetic layers may be alloys of Co, Fe, Ni, B, Pd, Tb or Hf, or other elements. The pinning layer magnetization is intended to be rigidly fixed in one orientation, so that it does not change in response to the applied magnetic field, but the magnetization direction of the ferromagnetic free layer is designed to change in response to the applied magnetic field. In the case of zero applied external magnetic field, the pinned and free layer magnetization directions are anti-parallel, and this can be achieved using stray flux coupling between the pinned and free layers, or by means of an additional pinned layer utilizing a synthetic antiferromagnet in the free layer, or by adding another antiferromagnet directly on top of the free layer. The tunnel barrier is composed of an insulating material, usually in the form of an oxide, such as $Al_2O_3$ or MgO. When the applied magnetic field is small, say B<200 G, then the stray field from the pinned layer may force the free layer to align in the anti-parallel orientation state. The preferred MTJ structure is given below:

a silicon substrate/seed layer/pinned layer/tunnel barrier layer/free layer/capping layer. Wherein the pinning layer is IrMn/CoFe/CoFeB, the tunnel barrier layer material is MgO, the free layer of CoFeB/NiFe. When the applied magnetic field is relatively large, such as the magnetic field intensity Bs>200 G, the use of a synthetic antiferromagnet in the pinned layer would be beneficial, and then an anti-ferromagnetic layer disposed above the free layer in the magnetization direction of the free layer in order to make it antiparallel with the pinned layer magnetization direction is necessary. In this case the structure of the MTJ element is preferably as follows:

Silicon substrate/seed layer/pinned layer/tunnel barrier layer/free layer/antiferromagnetic layer/protective layer, wherein the pinned layer is IrMn/CoFe/Ru/CoFeB, the tunnel barrier layer is MgO, the free layer as CoFeB/NiFe, capped with antiferromagnetic material IrMn.

Figure 11:
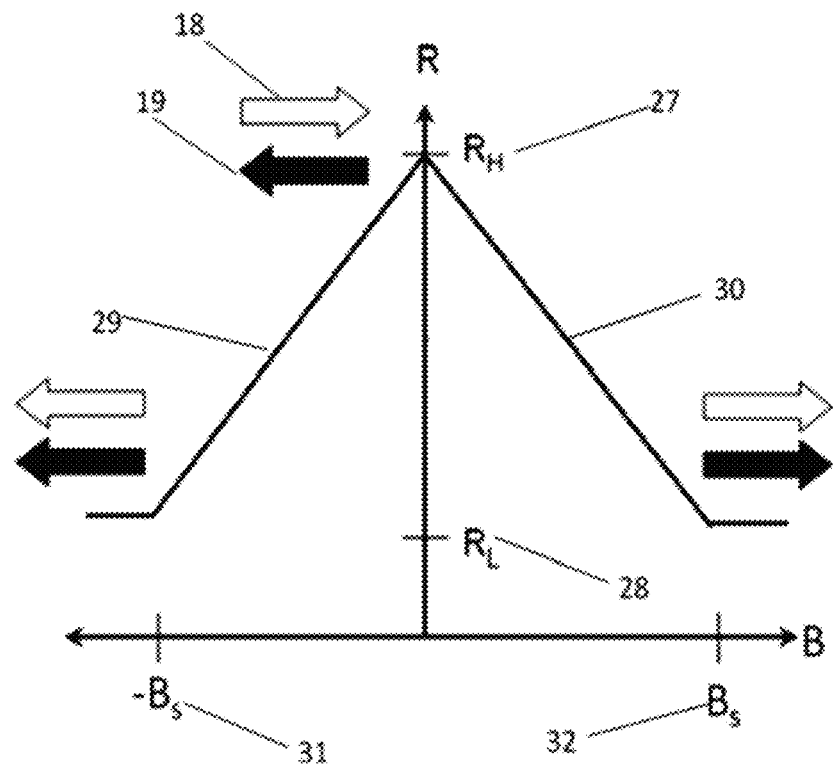
FIG. 11 shows a transfer curve for a film multilayer response for use in the present invention.

The transfer curve of a multilayer magnetic field bridge sensor is given in FIG. 11. When the applied magnetic field 101 is aligned parallel to the pinning layer magnetization direction 19, and if the magnetic field has a strength greater than −Bs 31 or Bs 32, then the magnetic field 101 and the free layer magnetization direction 18 are parallel, and additionally they are parallel to the pinned layer magnetization direction 19, such that the MTJ sensor element is in the low resistance state, $R_L$ 28. When the applied magnetic field is 0, the magnetization of the free layer 18 and the magnetization of the pinned layer 19 are anti-parallel, such that the MTJ sensor element is in the high resistance state, $R_H$ 27. The measurement range of the multilayer single-chip magnetic fied sensor bridge is from −Bs 31 to Bs 32. From the figure we can see, that between −Bs 31 and Bs 32 the curves 29, 30 are linear with slope given by $$(R_L-R_H)/B_S\Delta=\Delta R/\Delta B \quad (16)$$

from −Bs 31 to Bs 32 the magnetoresistance may be written as $$R(B_{ext})=R_H-(\Delta R/\Delta B)*|B_{ext}| \quad (17)$$

From equations (1) and (2), the magnetoresistance of each bridge arm may be written:

$$R_{sns}(B_{ext})=R_H-A_{sns}*(\Delta R/\Delta B)*|B_{ext}| \quad (18)$$

$$R_{ref}(B_{ext})=R_H-A_{ref}*(\Delta R/\Delta B)*|B_{ext}| \quad (19)$$

In addition, the sense element string 43 and the reference element string 44 may be a GMR multilayer film structure, that is, the multilayer structure CoFe/Cu/CoFe configured the same as its response curve as that of FIG. 10. As can be seen from FIG. 10, the sensor has good linearity.

Similar to the linear single-chip bridge magnetic field sensors, the multilayer single-chip magnetic field bridge sensor can be prepared in three manners, a referenced full-bridge, a referenced half-bridge, and a quasi-bridge. The calculation of the response of these three different single-chip sensor bridges is similar to those previously derived for linear sensor bridges, and for the sake of brevity, only the solutions are summarized below:

Referenced Full-Bridge: (20)

$$\frac{V}{V_{bias}}=\frac{(A_{sns}-A_{ref})\left(\frac{\Delta R}{\Delta B}\right)|B|}{2R_H+(A_{sns}+A_{ref})\left(\frac{\Delta R}{\Delta B}\right)|B|}$$

Referenced Half-Bridge: (21)

$$\frac{V}{V_{bias}}=\frac{R_H-A_{sns}\left(\frac{\Delta R}{\Delta B}\right)|B|}{2R_H+(A_{sns}+A_{ref})\left(\frac{\Delta R}{\Delta B}\right)|B|}$$

Quasi-Bridge: (22)

$$\frac{V}{I_{bias}}=(A_{sns}-A_{ref})\left(\frac{\Delta R}{\Delta B}\right)|B|$$

As can be seen from the above three formulas, the absolute value of the applied magnetic field B is used, suggesting the transfer curves are symmetric. In addition, the quasi-bridge and other two bridge structures have similar performance.

The half-bridge, full-bridge, and quasi-bridge can utilize a silicon substrate containing CMOS, such that a single chip sensor bridge including CMOS may be implemented.

The foregoing is only describes preferred embodiments of the present invention. It does not limit the present invention. Those skilled in the art, can produce various modifications and changes of the present invention. Any modification within the spirit and principles of the present invention, including any changes, equivalent replacements, or improvement are considered within the scope of the present invention.

The invention claimed is:

1. A single-chip magnetic field sensor bridge, comprising:
a substrate;
a half-bridge or a quasi-bridge on the substrate, the half-bridge or the quasi-bridge including:
a reference arm R1, which includes at least two row/column reference element strings, each reference element string includes one or more identical magnetoresistive sensor elements electrically interconnected;
a sensing arm S1, which includes at least two row/column sense element strings, each sense element string includes one or more identical magnetoresistive sensor elements electrically interconnected; the reference and the sensing arms have the same number of rows/columns, along the horizontal/vertical spacing directions, wherein the reference element strings of the reference arm R1 are interleaved with the sense element strings of the sensing arm S1, and the spacing between the adjacent reference element strings and the adjacent sense element strings is the same;

at least three shielding structures, with a well-defined gap between the shielding structures, each reference element string has a corresponding shielding structure, each sense element string is located in the corresponding gap, and further including multiple input and output wire bond pads, wherein the magnetoresistive sensor elements include anisotropic magnetoresistance (AMR), giant magnetoresistance (GMR) or tunneling magnetoresistance (TMR) sensor elements.

2. The single-chip magnetic field sensor bridge according to claim 1, wherein the magnetoresistive sensor elements include magnetic field sensor elements with a linear magnetic field response characteristic.

3. The single-chip magnetic field sensor bridge according to claim 1, wherein the magnetoresistive sensor elements include magnetic field sensor elements with a multilayer magnetic field response characteristic.

4. The single-chip magnetic field sensor bridge according to claim 1, wherein the reference element strings and the sense element strings have the same number of magnetoresistive sensing elements.

5. The single-chip magnetic field sensor bridge according to claim 1, wherein the single-chip magnetic field sensor bridge includes three wire bond pads, the first of the three wire bond pads is used to supply the bias voltage, the second is used for the output signal, and the third is used for grounding, the reference arm R1, the sense arm S1 all have their respective first end and second ends connected such that the first end of the reference arm R1 is connected to the first wire bond pad, the third bond pad and the sense arm S1 first end are electrically connected, the second bond pad is electrically connected with the second end of the reference arm R1 as well as electrically connected with the second end of the sense arm S1.

6. The single-chip magnetic field sensor bridge according to claim 1, wherein the single-chip magnetic field sensor bridge has three bond pads, the first bond pad is used for grounding, while the second and the third bond pads are used for the output, and the bridge includes two identical current sources (I1, I2), both of the current sources (I1, I2), the reference arm R1 and the sense arm S1 all respectively have a first end and a second end, the first wire bond pad is connected with the first end of the reference arm R1, the first end of the sensing arm S1, and additionally electrically connected with the first end of a current sources (I1, I2), the second wire bond pad is electrically connected with the second end of reference arm R1 and the second end of current source I2, the third wire bond pad is electrically connected with the second end of the sensing arm S1 and the second end of current source I1.

7. The single-chip magnetic field sensor bridge according to claim 1, wherein the shielding structures are elongated along the same horizontal/vertical direction, and they are composed of alloys including one or more of the materials Ni, Fe, Co, Si, B, Ni, Zr, or Al.

8. The single-chip magnetic field sensor bridge according to claim 1, wherein there is a gap between the shielding structures chosen such that the magnetic field gain factor is between $1<A_{sns}<100$, and the magnetic field in the region above or below the magnetic shield structures is described by the magnetic field attenuation coefficient $0<A_{ref}<1$.

9. The single-chip magnetic field sensor bridge according to claim 1, wherein the reference element string, the sense element string, and the bonds pads are electrically interconnected to each other.

10. The single-chip magnetic field sensor bridge according to claim 1, wherein the substrate includes CMOS, and the CMOS, the reference arm, the sense arm, and the wire bond pads are lithographically defined on the substrate.

11. A single-chip magnetic field sensor bridge, comprising:
a substrate;
a full-bridge on the substrate, the full-bridge includes mutual interconnection between a first bridge arm and a second bridge arm, the first bridge arm includes a first reference arm R1, which includes at least two rows/columns of the first reference element strings, each first reference element string consists of one or more electrically interconnected magnetoresistive sensor elements; as well as a first sense arm S1, which includes at least two rows/columns of the first sense element strings, each first sense element string consists of one or more electrically interconnected magnetoresistive sensor elements;
the reference element strings and the sense element strings have the same number of rows/columns, and the spacing along the longitudinal/vertical direction, describing the adjacent first reference element strings and first sense element strings is defined by length L, wherein the reference element strings of the reference arm R1 are interleaved with the sense element strings of the sensing arm S1;
the second bridge arm includes a second reference arm R2, which includes at least two rows/columns of the first reference element strings, each reference element string consists of one or more electrically interconnected magnetoresistive sensor elements, as well as a second sense arm S1, which includes at least two rows/columns of the second sense element strings, each sense element string consists of one or more electrically interconnected magnetoresistive sensor elements;
the second reference element string and the second sense element string have the same number of rows/columns, and the spacing along the longitudinal/vertical direction, describing the adjacent second reference element strings and second sense element strings is defined by length L, wherein the reference element strings of the reference arm R2 are interleaved with the sense element strings of the sensing arm S2;
in the area between the first bridge arm and the second bridge arm the first reference element string and the second reference element string or the first sense element string and the second reference element string are located adjacent to each other;
the adjacent the first reference element string and the second reference element string or the first sense element string and the second reference element string are separated by a distance 2L;
at least three shielding structures, wherein the shielding structures have a nearest neighbor spacing, and each of the first reference element strings and each of the second reference element strings are under a corresponding shielding structure, and each of the first sense element stings and each of the second elements strings is located in the gaps between the shielding structures; and a multiplicity of input and output wire bond pads,
wherein the magnetoresistive sensor elements are anisotropic magnetoresistance (AMR), giant magnetoresistance (GMR), or tunneling magnetoresistance (TMR) sensor elements.

12. The single-chip magnetic field sensor bridge according to claim 11, wherein the single-chip magnetic field sensor bridge includes four wire bond pads, these four wire bond pads are respectively defined as a first wire bond pad used for bias voltage, the second and third wire bond pads are used for outputs, and the fourth wire bond pad is used for grounding, the reference arm R1, the reference arm R2, the sensing arm S1 and the sensing arm S2 respectively have a first end and a second end, and the first bond pad is electrically connected with the second end of reference arm R2 and the first end of sensing arm S1, the second wire bond pad is electrically connected with the second end of reference arm R1 and the second end of sensing arm S1, the third wire bond pad is electrically connected with the first end of sensing arm S2 and the first end of reference arm R2, and the fourth wire bond pad is electrically connected with the second end of sensing arm S2 and the first end of reference arm R1.

13. The single-chip magnetic field sensor bridge according to claim 11, wherein the shielding structures are elongated along the same horizontal/vertical direction, and they are composed of alloys including one or more of the materials Ni, Fe, Co, Si, B, Ni, Zr, or Al.

14. The single-chip magnetic field sensor bridge according to claim 11, wherein there is a gap between the shielding structures chosen such that the magnetic field gain factor is between $1<A_{sns}<100$, and the magnetic field in the region above or below the magnetic shield structures is described by the magnetic field attenuation coefficient $0<A_{ref}<1$.

15. The single-chip magnetic field sensor bridge according to claim 11, wherein the reference element string, the sense element string, and the bonds pads are electrically interconnected to each other.

16. The single-chip magnetic field sensor bridge according to claim 11, wherein the magnetoresistive sensor elements include is magnetic field sensor elements with a linear magnetic field response characteristic.

17. The single-chip magnetic field sensor bridge according to claim 11, wherein the magnetoresistive sensor elements include magnetic field sensor elements with a multi-layer magnetic field response characteristic.

18. The single-chip magnetic field sensor bridge according to claim 11, wherein the second reference element string and the first reference element string have the same number of rows/columns, while the second sense element string and the first sense element string have the same number of rows/columns.

19. The single-chip magnetic field sensor bridge according to claim 11, wherein the number of first reference element strings, the number of first sense element stings, the number of second reference element strings, and the number of second sense element strings is the same.

20. The single-chip magnetic field sensor bridge according to claim 11, wherein the substrate includes CMOS, and the CMOS, the reference arm, the sense arm, and the wire bond pads are lithographically defined on the substrate.

* * * * *